United States Patent
Kim et al.

(10) Patent No.: US 7,215,008 B2
(45) Date of Patent: May 8, 2007

(54) IN-LINE APPARATUS AND METHOD FOR MANUFACTURING DOUBLE-SIDED STACKED MULTI-CHIP PACKAGES

(75) Inventors: Tae-Hyun Kim, Asan-si (KR); Young-Kyun Sun, Cheonan-si (KR); Hyun-Ho Kim, Seoul (KR); Jung-Hwan Woo, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 43 days.

(21) Appl. No.: 10/874,195

(22) Filed: Jun. 24, 2004

(65) Prior Publication Data
US 2005/0006743 A1  Jan. 13, 2005

(30) Foreign Application Priority Data
Jul. 1, 2003  (KR) .................. 10-2003-0044252

(51) Int. Cl.
*H01L 23/495* (2006.01)
*H01L 23/48* (2006.01)
(52) U.S. Cl. ............... 257/666; 257/676; 257/777
(58) Field of Classification Search ........ 257/666, 257/676, 685, 686, 777, 778
See application file for complete search history.

(56) References Cited

U.S. PATENT DOCUMENTS
5,366,933 A  11/1994  Golwalkar et al.

FOREIGN PATENT DOCUMENTS
KR  2001-067312  7/2001

*Primary Examiner*—Hung Vu
(74) *Attorney, Agent, or Firm*—Harness, Dickey & Pierce, P.L.C.

(57) ABSTRACT

Provided are in-line semiconductor chip packaging apparatuses that include a buffer assembly in which a reversing unit rotates a lead frame 180° between die attaching and/or wire bonding operations and methods of manufacturing an integrated circuit chip package using such an in-line integrated circuit chip packaging apparatus. Between packaging process operations, the lead frame, which includes first and second surfaces may be rotated, thereby reversing the orientation of the first and second surfaces. The apparatuses will include one or more processing units for attaching semiconductor chips to the leadframe, or a previously mounted semiconductor chip, or for forming wire bonds between the attached semiconductor chip(s) and the corresponding lead fingers of the lead frame, attached to and/or separated by an in-line buffer assembly that includes a reversing unit.

7 Claims, 12 Drawing Sheets

IN-LINE APPARATUS AND METHOD FOR MANUFACTURING DOUBLE-SIDED STACKED MULTI-CHIP PACKAGES

BACKGROUND OF THE INVENTION

This application claims priority from Korean Patent Application No. 2003-44252, which was filed on Jul. 1, 2003, in the Korean Intellectual Property Office, the disclosure of which is incorporated herein in its entirety by reference.

1. Field of the Invention

The present invention relates to an in-line integrated circuit chip packaging apparatus and a method for manufacturing in-line integrated circuit chip packages and, more particularly, to an in-line integrated circuit chip packaging apparatus for manufacturing a double-sided stacked multi-chip packages using wire bonding techniques and a method of manufacturing integrated circuit chip packages using the same.

2. Description of the Related Art

The continuing demand for improvements in mobile phones and other personal electronics such as PDAs, MP3 players, digital cameras and notebook computers, has resulting in a corresponding demand for electronic devices that are smaller, lighter, higher capacity and more highly integrated. One method of achieving these requirements involves loading several integrated circuit chips onto a single electronic device using a multi-chip packaging technique. Multi-chip packaging techniques, which produce a single package containing a plurality of individual integrated circuit chips, reduces the size and weight of an electronic device as well as the area required to mount the semiconductor chips within the electronic device.

In a conventional integrated circuit chip packaging process, a lead frame is used for providing electrical connections between the semiconductor chip and an external device. The lead frame is typically manufactured as a strip configured for packaging 8 or 16 semiconductor chips simultaneously.

One multi-chip packaging technique, the stack type loading method, involves loading a plurality of semiconductor chips on both faces of the lead frame. Other multi-chip packaging techniques include both the dual die package (DDP) method which involves stacking of two semiconductor chips, one chip on each face of the lead frame, and the quad die package (QDP) method, which involves stacking four chips, two chips on each face, on the lead frame.

FIG. 1 is a cross-sectional view of a conventional DDP 10. As illustrated in FIG. 1, a conventional DDP 10 typically includes a first semiconductor chip 11 and a second semiconductor chip 13, which are mounted on a lead frame 20 that includes a die pad 21 and a lead finger 23. The first semiconductor chip 11 and the second semiconductor chip 13 are attached on an upper face and a lower face of the die pad 21 using a first bonding layer 25 and a second bonding layer 26, respectively. The first semiconductor chip 11 is electrically connected to the lead finger 23 via a wire bond 27, and the second semiconductor chip 13 is electrically connected to the lead finger 23 via a wire bond 28. The first semiconductor chip 11, the second semiconductor chip 13, and the wire bonds 27 and 28 are protected from an external environment by a plastic molding 31, which is formed from a material such as an epoxy molding compound, which encapsulates and seals the more sensitive portions of the structure.

FIG. 2 is a cross-sectional view of a typical QDP structure. As illustrated in FIG. 2, a conventional QDP 30 includes four semiconductor chips 31, 33, 35, and 37, which are loaded on a lead frame 40 that includes a die pad 41 and a lead finger 43. During the manufacture of a conventional QDP according to FIG. 2, the first and second semiconductor chips 31, 33 are sequentially attached to an upper face of the die pad 41 using first and second bonding layers 45, 47 respectively. Similarly, the third and fourth semiconductor chips 35, 37 will be sequentially attached to a lower face of the die pad 41 using third and fourth bonding layers 46, 48. The first semiconductor chip 31 may then be electrically connected to the lead finger 43 using bonding wires 51 and the second semiconductor chip 33 may be electrically connected to the lead finger using bonding wires 53. Similarly, the third semiconductor chip 35 may be electrically connected to the lead finger 43 using bonding wires 55 and the fourth semiconductor chip 37 may be electrically connected to the lead finger 43 using bonding wires 57.

The four semiconductor chips 31, 33, 35, 37, the corresponding bonding wires 51, 53, 55, and 57, and the bonding regions of the chips and the lead fingers may then be sealed in a plastic molding 61 formed from a material such as an epoxy mold compound (EMC) or other suitable composition.

A method of manufacturing a conventional integrated circuit chip packages such as the DDP and the QDP configurations depicted in FIGS. 1 and 2 typically includes a die attach process for attaching an individual semiconductor chip that has been separated from a wafer to the lead frame or a semiconductor chip that has been previously mounted on the lead frame. A wire bonding process is then used for establishing electrical connections between the semiconductor chip and the lead frame using conductive metal wires. A molding process is then utilized to encapsulate and protect the semiconductor chips, bonding wires and inner portions of the lead frame in a molding resin to protect against environmental contamination or mechanical damage, followed by a trim/form process for cutting and/or bending the exterior portion of the lead finger to obtain a desired lead configuration. Once the individual packages have been completed, they may be subjected to some post-assembly functional, parametric and/or accelerated life testing to evaluate the yield of the assembly process and the reliability of the resulting semiconductor chip packages. Because two semiconductor chips, for DDPs, or four semiconductor chips, for QDPs, are combined in a single package, both the overall area within the electronic device and the mounting area(s) on the circuit substrate can be decreased. Therefore, electronic devices that utilize these techniques and configurations can achieve an improved degree of miniaturization and increase density.

However, conventional apparatuses for manufacturing an integrated circuit chip package typically utilize separate processes and distinct pieces of equipment for the various die attaching, wire bonding and adhesive curing steps. Therefore, when manufacturing a DDP or QDP using a conventional integrated circuit chip package apparatus, an operator must sequentially load the lead frame into and unload the lead frame the die attaching unit, the wire bonding unit, and the curing oven for each semiconductor chip that will be attached to the lead frame. For example, in manufacturing a DDP such as that depicted in FIG. 1, an operator must typically manually transfer the lead frame at least five times since the processes of attaching, oven curing and chip bonding must each be done twice. Similarly, in manufacturing a QDP such as that depicted in FIG. 2, an operator must typically manually transfer the lead frame at least eleven times over the course of performing each of the processes four times in order to mount all four chips.

Therefore, the conventional method of manufacturing multi-chip integrated circuit chip package process is complex, tends to require repeated operator intervention, much of which involves transferring the lead frames of the partially completed devices between various apparatus, and is time-consuming. The convention methods and apparatus, therefore, tend to decrease productivity.

SUMMARY OF THE INVENTION

The exemplary embodiments of the present invention provide in-line integrated circuit chip packaging apparatuses that can be used to simplify the packaging process and reduce the need for operator involvement during the manufacture of doubled-sided stack multi-chip packages.

The exemplary embodiments of the present invention also provide methods for manufacturing integrated circuit chip packages that can reduce the associated labor and process times and thereby increase productivity by simplifying the manufacturing process for doubled-sided stack multi-chip packages.

According to one exemplary embodiment of the present invention, an in-line integrated circuit chip packaging apparatus comprises a loading unit which supplies a lead frame having a first surface and a second surface opposite the first surface from a supply magazine containing the lead frame, a first package fabricating unit which performs the operations required to attach a first semiconductor chip to the first surface of the lead frame, a second package fabricating unit which attaches a second semiconductor chip to the second surface of the lead frame, and an unloading unit which unloads the lead frame from the second package fabricating unit and fills a receiving magazine. A buffer, interposed between the first package fabricating unit and the second package fabricating unit, includes a reversing unit which rotates the lead frame so that the second surface, that was initially directed downward, is fed into the second package fabricating unit directed upward.

The buffer includes a guide rail which guides the lead frame in a first direction, a driving shaft, which can extend perpendicularly to the first direction, mounted on a side of the guide rail, and a driving motor which supplies driving power to the driving shaft to rotate the guide rail a predetermined angle about an axis of the driving shaft.

The reversing unit may also include a fixing unit which supports and holds the lead frame so that the lead frame does not derail when the guide rail is rotated about the axis of the driving shaft. The guide rail supports at least one lead frame strip that will be reversed during each rotation by the reversing unit. The driving unit may supply driving power to the driving shaft using an air cylinder.

The buffer also includes both a first lead frame conveyor, that conveys the lead frame from the first package fabricating unit to the reversing unit, and a second lead frame conveyor that conveys the lead frame to the second package fabricating unit.

The first lead frame conveyor and the second lead frame conveyor may include a pusher, operated by a cylinder, that pushes the lead frame to a next stage. A pusher operated by an air cylinder may be used to push the lead frames one by one from the magazine to the first package fabricating unit can be installed in the loading unit.

The first and second package fabricating units can include die attaching units that attach semiconductor chips to the lead frame and/or wire bonding units that electrically connects the semiconductor chip attached to the lead frame to the lead frame.

According to another embodiment of the present invention, an in-line integrated circuit chip packaging apparatus includes a loading unit which supplies a lead frame having a first surface and a second surface opposite the first surface from a supply magazine holding the lead frame, a first die attaching unit, which attaches a first semiconductor chip on the first surface of the lead frame, a second die attaching unit, which attaches a second semiconductor chip on the second surface of the lead frame, a buffer, interposed between the first die attaching unit and the second die attaching unit, that includes a reversing unit which rotates the lead frame so that the orientation of the first and second surfaces is reversed before the lead frame is supplied to the second package fabricating unit, and an unloading unit which unloads the lead frame from the second package fabricating unit to a receiving magazine.

According to a still another embodiment of the present invention, an in-line integrated circuit chip packaging apparatus includes a loading unit which supplies a lead frame having a first surface and a second surface opposite the first surface from a supply magazine holding the lead frame, a first bonding unit which electrically connects a first semiconductor chip attached to the first surface of the lead frame to the lead frame by wire bonding, a second wire bonding unit which electrically connects the second semiconductor chip attached to the second surface of the lead frame to the lead frame by wire bonding, a buffer, interposed between the first wire bonding unit and the second wire bonding unit, that includes a reversing unit which rotates the lead frame so that the orientation of the first and second surfaces is reversed before the lead frame is supplied to the second package fabricating unit, and an unloading unit which unloads the lead frame from the second package fabricating unit to a receiving magazine.

According to a yet another embodiment of the present invention, an in-line integrated circuit chip packaging apparatus including a loading unit which supplies a lead frame having a first surface and a second surface opposite the first surface from a supply magazine holding the lead frame, a package fabricating unit which performs a process required to attach a semiconductor chip to the upward facing surface of the lead frame, an unloading unit which unloads the lead frame from the package fabricating unit to a receiving magazine, a buffer, disposed between the package fabricating unit and the unloading unit, which conveys the lead frame selectively to one of the package fabricating unit and the unloading unit depending on the state of the lead frame unloaded from the package fabricating unit, and a reversing unit, which rotates the lead frame so that both the first and the second surfaces of the lead frame may be directed upward before being returned to the package fabricating unit. The apparatus may be configured and/or operated so that the lead frame conveyor returns the lead frame to the package fabricating unit only once after the reversing unit rotates the lead frame.

According to yet another embodiment of the present invention, an integrated circuit chip package may be manufactured by loading a lead frame including a die pad having a first surface and a second surface opposite the first surface and a lead finger into a first die attaching unit oriented so that the first surface of the die pad is directed upward, attaching a first semiconductor chip to the first surface of the die pad in the first die attaching unit, rotating the lead frame in the reversing unit, to which the first semiconductor chip has been attached, so that the second surface of the die pad is directed upward, the first die attaching unit, the reversing unit and the second die attaching unit having an in-line, loading the lead frame into the second attaching unit, and attaching a second semiconductor chip to the second surface of the die pad in the second die attaching unit.

An adhesive tape, such as an UV tape, may be used to attach the first semiconductor chip and the second semiconductor chip to the die pad. A first heat or UV treatment to cure the adhesive tape used to bond the first and the second semiconductor chips to the first and second faces of the lead frame may be performed after both chips are attached. A wire bonding process may then be performed to form electrical connections between the first and second semiconductor chips and the lead fingers after the adhesive tape has been cured. The wire bonding process typically includes forming a series of first wire bonds that electrically connect the first semiconductor chip to the lead fingers, rotating the lead frame so that the second surface is directed upward, and forming a series of second wire bonds that electrically connect the second semiconductor chip to the lead fingers.

The method can further include attaching a third semiconductor chip to the first semiconductor chip in the first die attaching unit, rotating the lead frame so that the second surface of the die pad is directed upward using the reversing unit, loading the lead frame in the second die attaching unit so that the second surface of the die pad is directed upward, and attaching a fourth semiconductor chip to the second semiconductor chip in the second die attaching unit. An adhesive tape, such as an UV tape, may be used to attach the third and fourth semiconductor chips to the previously attached first and second semiconductor chips, respectively. A second heat or UV treatment may be performed to cure the adhesive tape used for attaching the third and the fourth semiconductor chips to the first and the second semiconductor chips.

The method will also typically include a wire bonding process for electrically connecting the third semiconductor chip and the fourth semiconductor chip to the lead fingers after the second adhesive tape curing treatment. The wire bonding process includes forming a third series of wire bonds that electrically connect the third semiconductor chip to the lead fingers, rotating the lead frame so that the second surface is directed upward, and forming a fourth series of wire bonds that electrically connect the fourth semiconductor chip to the lead fingers.

According to another embodiment of the present invention, an integrated circuit chip package may be manufactured using a wire bonding process to form electrical connections between the first and a second semiconductor chips and the lead fingers of a lead frame, which includes a die pad having a first surface and a second surface opposite the first surface, on which the first and the second semiconductor chip are attached, the method comprising forming a first series of wire bonds that electrically connect the first semiconductor chip to the lead fingers in a first wire bonding unit, rotating the lead frame on which the first wire bonds have been formed so that the second surface of the die pad is directed upward using a reversing unit which is connected in-line with the first wire bonding unit, and forming a second series of wire bonds that electrically connect the second semiconductor chip to the lead fingers using a second wire bonding unit which is connected in-line with the reversing unit.

The in-line integrated circuit chip packaging apparatus according to the exemplary embodiments of the present invention, can simplify the packaging process, reduce the amount of handling by an operator during the packaging operation and reduce the turn around time (TAT), thereby tending to increase the productivity of the integrated circuit chip packaging process.

BRIEF DESCRIPTION OF THE DRAWINGS

The above and other features and advantages of the present invention will become more apparent by describing in detail certain exemplary embodiments thereof with reference to the attached drawings in which.

DETAILED DESCRIPTION OF EXEMPLARY EMBODIMENTS

The present invention will be described more fully with reference to the accompanying drawings, in which exemplary embodiments of the invention are shown. It should be understood, however, that exemplary embodiments of the present invention described herein can be modified in form and detail without departing from the spirit and scope of the invention. Accordingly, the exemplary embodiments described herein are provided by way of example and not of limitation, and the scope of the present invention is not restricted to the particular embodiments described herein.

Figure 1:
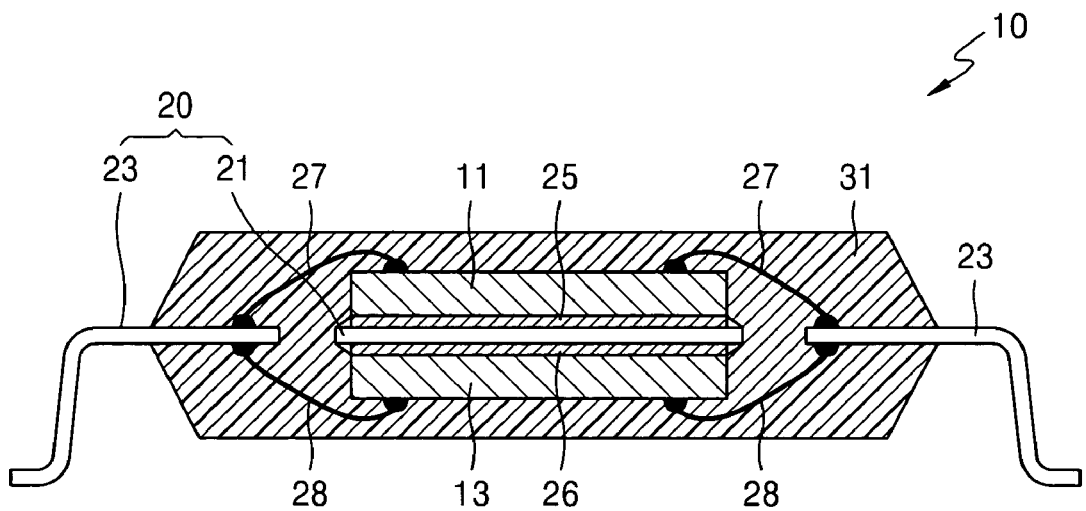
FIG. 1 is a cross-sectional view of a structure of a conventional dual die package (DDP)
Figure 2:
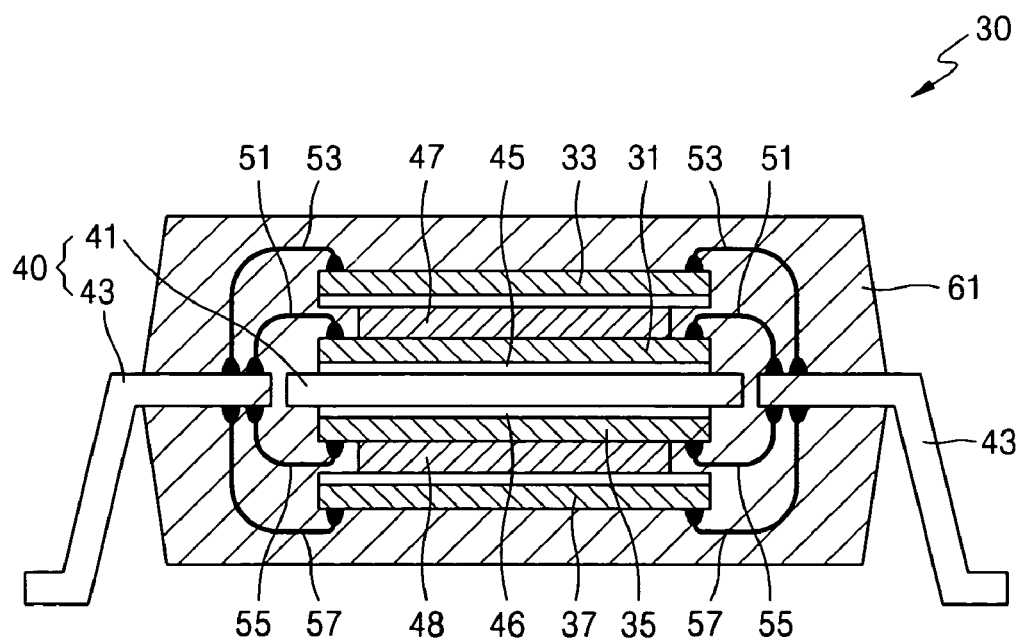
FIG. 2 is a cross-sectional view of a structure of a conventional quad die package (QDP)
Figure 3:
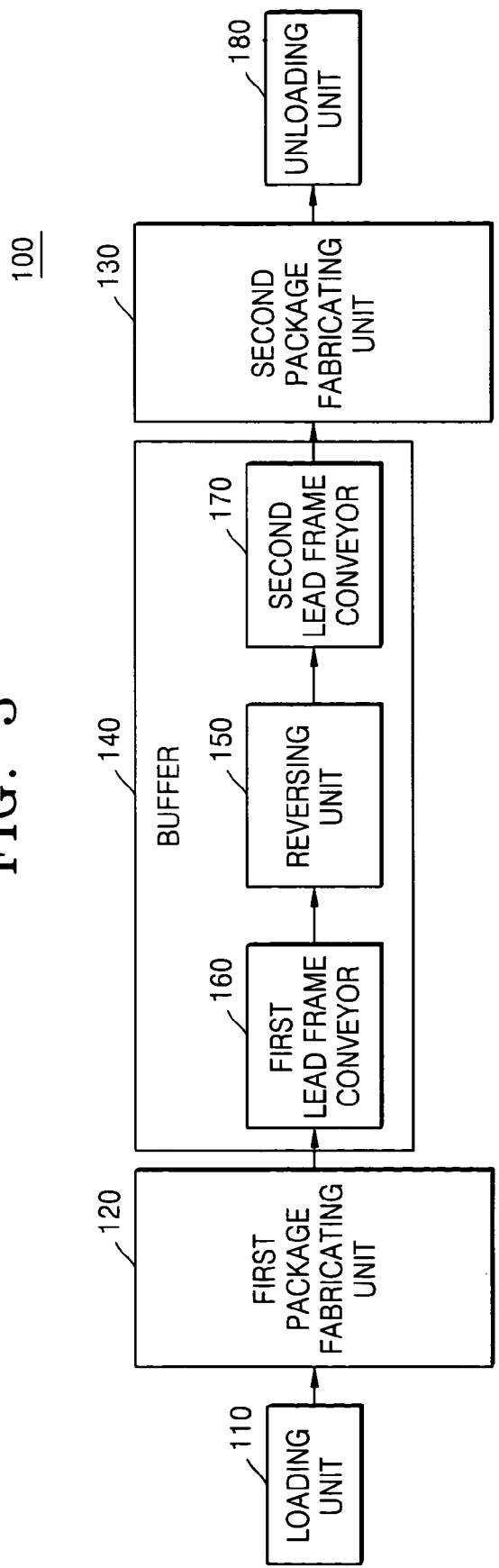
FIG. 3 is a block diagram illustrating an in-line integrated circuit chip packaging apparatus according to an exemplary embodiment of the present invention.

FIG. 3 is a block diagram illustrating an in-line integrated circuit chip packaging apparatus according to a first exemplary embodiment of the present invention. Referring to FIG. 3, an exemplary in-line integrated circuit chip packaging apparatus 100 includes a loading unit 110 to which a lead frame is supplied in a supply magazine, and first and second package fabricating units 120 and 130 that perform predetermined processes for attaching semiconductor chips to the lead frames supplied from the loading unit 110. The first and second package fabricating units 120 and 130 can respectively perform, for example, die attaching processes for attaching semiconductor chips onto the lead frame and/or wire bonding processes for electrically connecting the semiconductor chips to the lead frame using bonding wires. The first and second package fabricating units 120 and 130 are connected through a buffer 140 disposed there between. After fabrication is complete, the lead frame is unloaded from the second package fabricating unit 130 by an unloading unit 180 and transferred to a receiving magazine.

Figure 4:
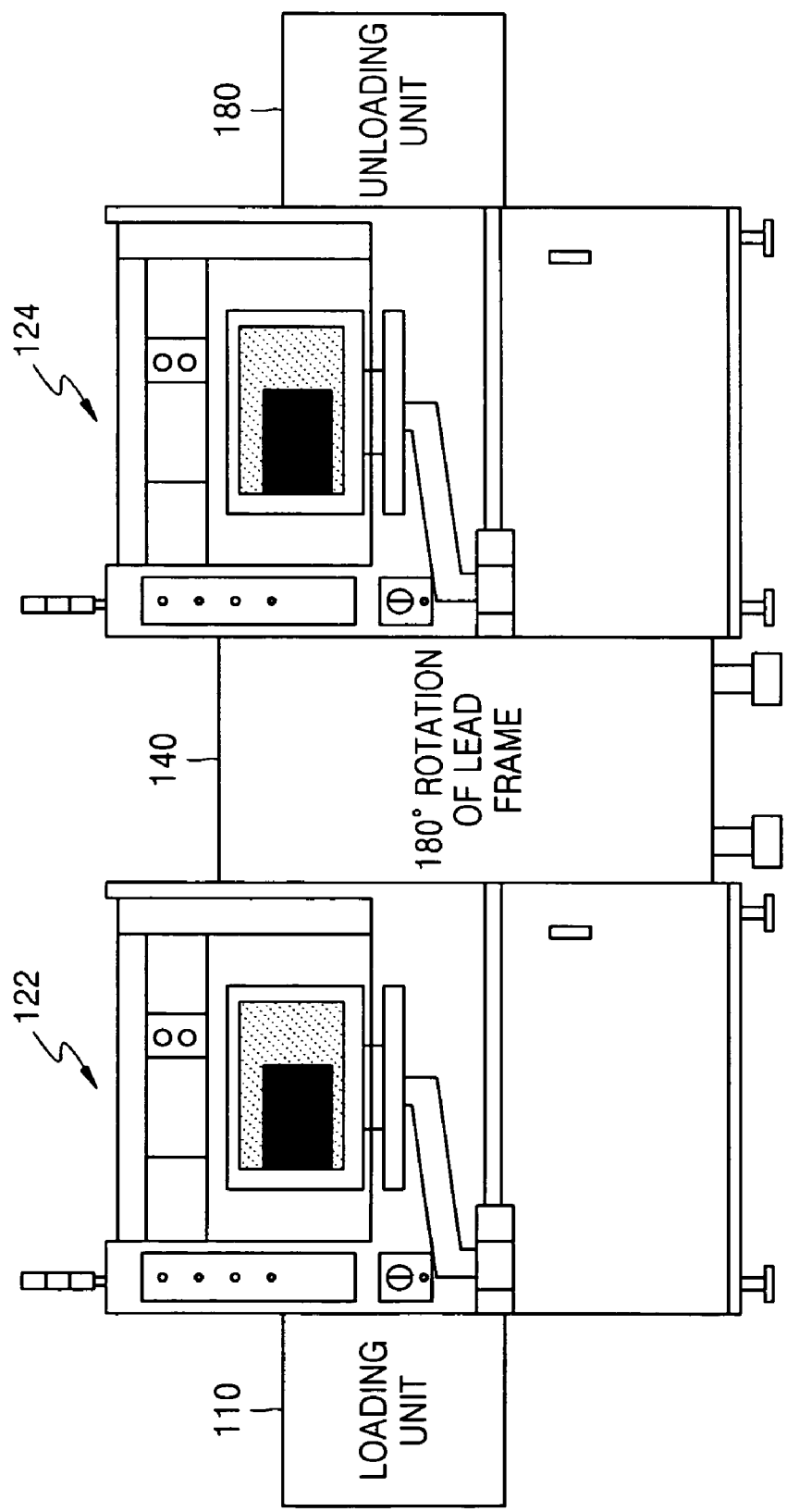
FIG. 4 is a illustration of an in-line integrated circuit chip packaging apparatus composing a wire bonding unit according to an exemplary embodiment of the present invention.

The buffer 140 includes a reversing unit 150 that reverses the lead frame orientation by rotating the lead frame 180° so that a surface of the lead frame that initially faces upward will be facing downward before transferring the lead frame to the second fabricating unit 130. The buffer 140 also comprises a first lead frame conveyor 160 that conveys the lead frame from the first package fabricating unit 120 to the reversing unit 150, and a second lead frame conveyor 170 that conveys the lead frame from the reversing unit 150 to the second package fabricating unit 130. FIG. 4 illustrates first and second package fabricating units 120 and 130 that include wire bonding units 122 and 124, respectively. FIG. 4 illustrates a configuration including wire bonding units, but these can be replaced by or supplemented with die attaching units as required.

Figure 5A:
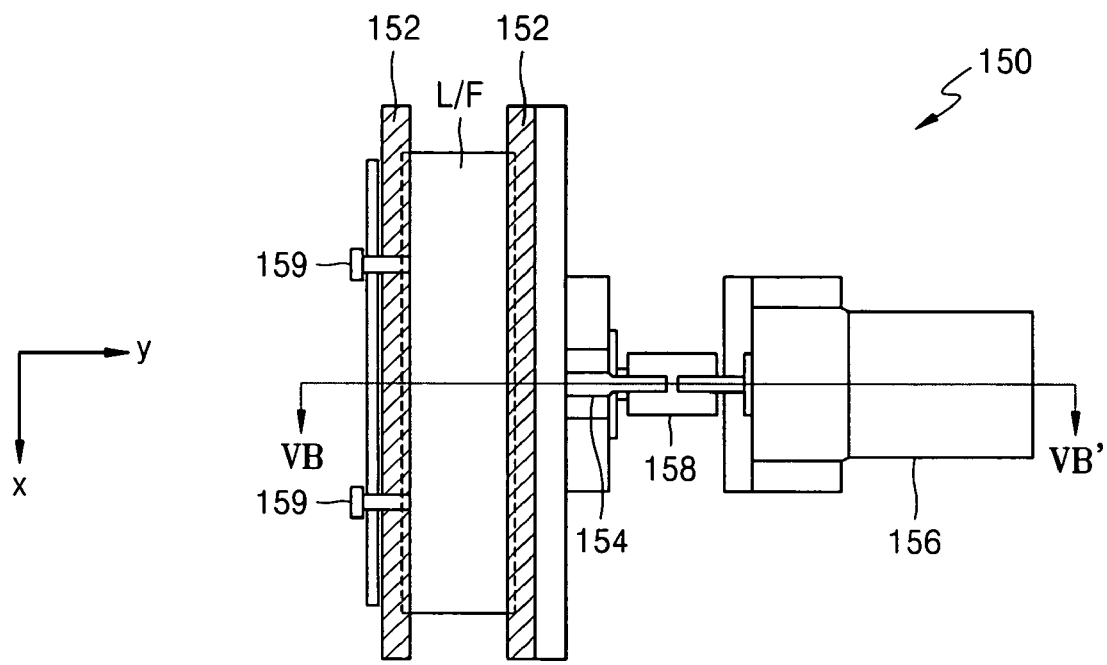
FIG. 5A is a schematic diagram of a configuration of a reversing unit of the in-line integrated circuit chip packaging apparatus according to an exemplary embodiment of the present invention.
Figure 5B:
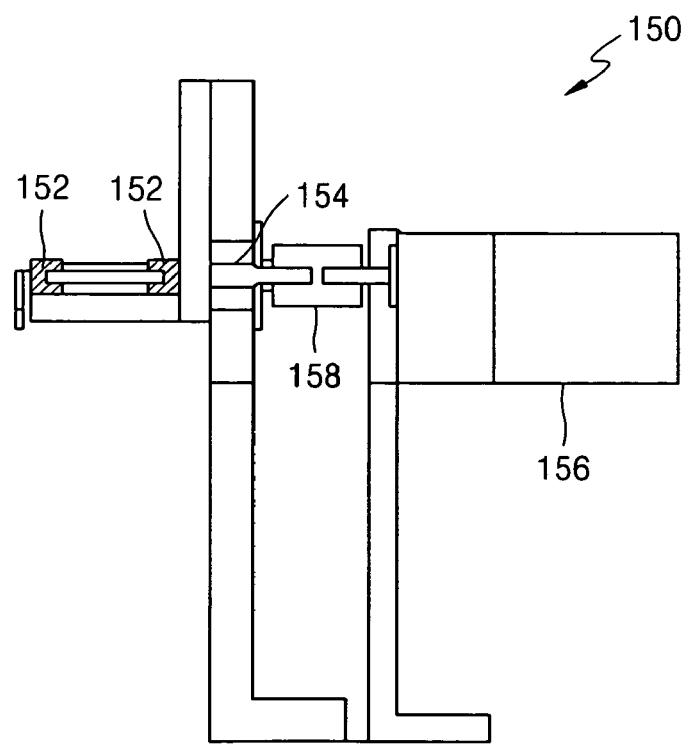
FIG. 5B is a cross-sectional view taken along a line VB–VB' in FIG. 5A.

FIGS. 5A and 5B are schematic diagrams of a portion of the reversing unit 150. FIG. 5A is a top view of the reversing unit 150 and FIG. 5B is a cross-sectional view taken along a line VB–VB' in FIG. 5A. Referring to FIGS. 5A and 5B, the reversing unit 150 includes a guide rail 152 that guides that movement of the lead frame L/F received from the first package fabricating unit 120 through the first lead frame conveyor 160 in a constant direction, i.e., an X direction. The guide rail 152 can also be designed and configured to divert the movement of the lead frame in either X direction and/or Y direction as required. The guide rail 152 supports at least one lead frame strip while it is being reversed by the reversing unit 150.

A driving shaft 154 is mounted adjacent to the guide rail 152 and extends in the Y direction, i.e., perpendicular to the X direction. A driving motor 156 may be used to rotate the guide rail 152 in a predetermined angular direction about an axis of the driving shaft 154, and is connected to the driving shaft 154 through a coupling 158. When the driving shaft 154 is rotated by the driving motor 156, the guide rail 152 rotates 180° about the axis of the driving shaft 154. The driving motor 156 may supply power to the driving shaft 154 via an air cylinder (not shown) and may provide a smooth reversing motion as the guide rail 152 is rotating 180°. The reversing direction of the guide rail 152 can be controlled as required, that is, the reversing direction can be clockwise or counter clockwise about the axis of the driving shaft 154. The angular speed of the lead frame may also be varied to provide a slow "soft" landing of the guide rail without unduly slowing the reversing process. A fixing unit 159 mounted on the reversing unit 150 may be used to hold or otherwise fix the position of the lead frame L/F relative to the guide rail 152 as the guide rail is being reversed.

Figure 6:
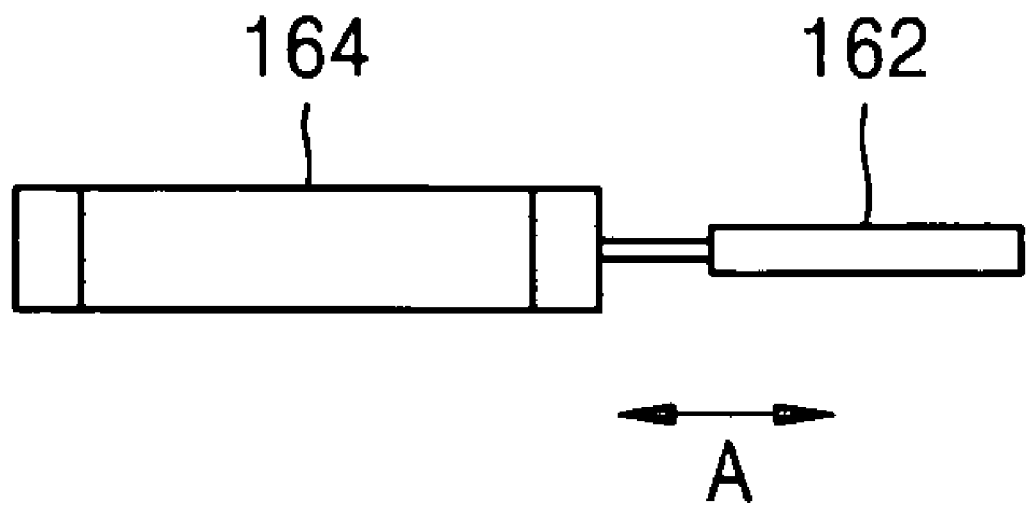
FIG. 6 is a schematic diagram of a pusher that may be used in the in-line integrated circuit chip packaging apparatus according to the exemplary embodiment of the present invention.

FIG. 6 illustrates a pusher 162 that can be mounted on the first and second lead frame conveyors 160, 170 in the buffer 140. The pusher 162 may be used to push the lead frame to a next stage for processing. The pusher 162 may be moved reciprocally along the direction A by operation of a cylinder 164. The pusher 162 can be mounted on one or both of the first lead frame conveyor 160 and the second lead frame conveyor 170 as required for lead frame movement. For example, the pusher 162 can be used to push a lead frame L/F conveyed by the first lead frame conveyor 160 to the guide rail 152 of the reversing unit 150. The pusher 162 can also be used to push a lead frame L/F to the second lead frame conveyor 170 after the lead frame has been rotated 18020 by operation of the reversing unit 150.

The pusher 162 can also be mounted on the loading unit 110. In such a case, a plurality of lead frames stored in the supply magazine can be supplied to the first package fabricating unit 120 one-by-one by indexing the supply magazine position with synchronized operation of a pusher 162 mounted on the loading unit 110.

A process for manufacturing an in-line integrated circuit chip package using the in-line integrated circuit chip packaging apparatus 100 will now be described. When a lead frame with a first surface and a second surface opposite the first surface is supplied to the first package fabricating unit 120 from the loading unit 110, the first surface of the lead frame is directed upward.

In the first package fabricating unit 120, a die attach process and/or a wire bonding process is performed on the first surface of the lead frame. Then, the lead frame is conveyed from the first package fabricating unit 120 to the buffer 140. The first lead frame conveyor 160 of the buffer 140 conveys the lead frame to the reversing unit 150. The reversing unit 150 rotates the lead frame by 180° so that the second surface of the lead frame is directed upward.

The reversed lead frame with the second face upward is then conveyed to the second package fabricating unit 130 by the second lead frame conveyor 170. After performing a die attaching process and/or a wire bonding process on the second face of the lead frame in the second package fabricating unit 130, the lead frame is unloaded from the second package fabricating unit 130. The unloaded lead frame is loaded to a receiving magazine by the unloading unit 180.

Figure 7:
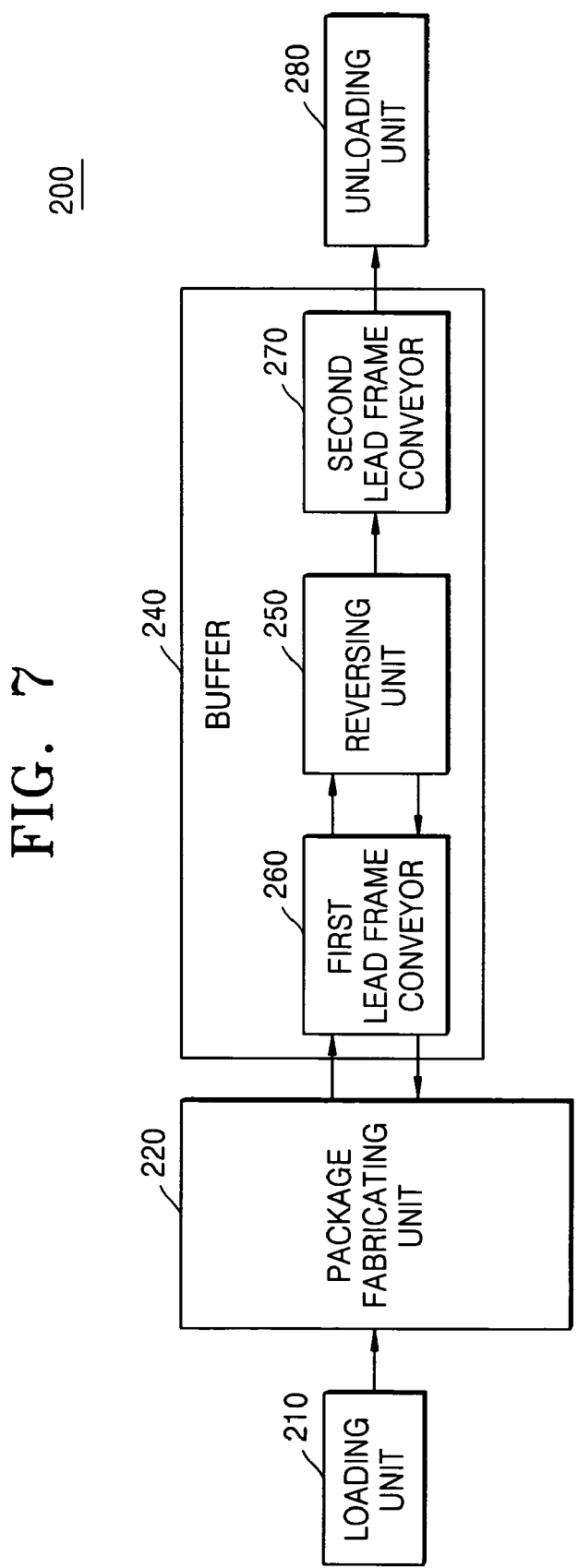
FIG. 7 is a block diagram illustrating an in-line integrated circuit chip packaging apparatus according to a second exemplary embodiment of the present invention.

FIG. 7 is a block diagram of an exemplary apparatus 200 for manufacturing an in-line integrated circuit chip package according to a second embodiment of the present invention. Referring to FIG. 7, the apparatus 200 may include a loading unit 210 to which a lead frame is supplied from a supply magazine, a package fabricating unit 220, which mounts a semiconductor chip on the lead frame supplied from the loading unit 210 or the first lead frame conveyer 260, and an unloading unit 280 which unloads the processed lead frame from the buffer 240 into a receiving magazine.

In the package fabricating unit 220, a die attaching process and/or wire bonding process can be performed. The package fabricating unit 220 and the unloading unit 280 are arranged in-line with a buffer 240 disposed therebetween. The buffer 240 selectively returns the lead frame to the package fabricating unit 220 or to the unloading unit 280 according to the state of completion of the lead frame during the packaging process. The buffer 240 includes a reversing unit 250 that rotates the lead frame by 180° so that the orientation of the first and second surfaces may be reversed between processing steps within the package fabricating unit 220. The buffer 240 also includes a first lead frame conveyor 260 that conveys the lead frame between the package fabricating unit 220 and the reversing unit 250, and a second lead frame conveyor 270 that conveys the lead frame between the reversing unit 250 and the unloading unit 280.

The reversing unit 250, the first lead frame conveyor 260, and the second lead frame conveyor 270 may generally be configured and operated as explained above with reference to the FIGS. 3, 5A, 5B, and 6. However, in this embodiment, the reversing unit selectively reverses the lead frame 180° according to the state of the lead frame as it is received from the package fabricating unit 220.

More specifically, when the lead frame is supplied from the loading unit 210 to the package fabricating unit 220, the first surface of the lead frame is directed upward. After performing a die attaching process and/or a wire bonding process on the first face of the lead frame in the package fabricating unit 220, the lead frame is conveyed to the reversing unit 250 via the first lead frame conveyor 260. The reversing unit 250 rotates the lead frame 180° so that the second surface of the lead frame is directed upward. The lead frame is then conveyed back to the package fabricating unit 220 via the first lead frame conveyor 260 with the second surface directed upward. In the package fabricating unit 220, a die attaching process and/or a wire bonding process is performed on the second face of the lead frame. The completed lead frame is transferred from the package fabricating unit 220 to the reversing unit 250 by the first lead frame conveyor 260. The reversing unit 250, typically without reversing the lead frame, conveys the lead frame to the second lead frame conveyor 270 after all of the desired semiconductor chips have been attached to the first and second surfaces of the lead frame within the package fabricating unit 220. Then, the lead frame is conveyed to the unloading unit 280 where the lead frame is placed in a receiving magazine.

Figure 8:
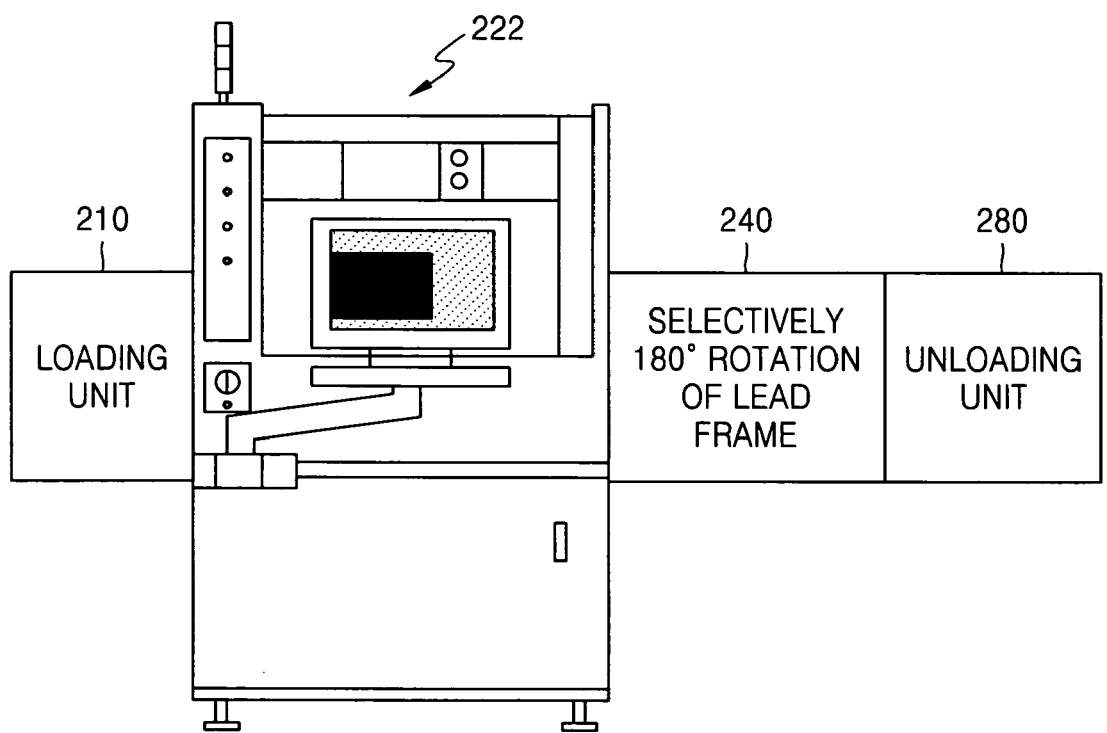
FIG. 8 is a schematic view of the in-line integrated circuit chip packaging apparatus including a wire bonding unit according to a second exemplary embodiment of the present invention.

FIG. 8 is a schematic view of a package fabricating unit 220 including a wire bonding unit 222. In FIG. 8, a wire bonding unit is illustrated, but the wire bonding unit can be replaced with or supplemented by a die attaching unit as desired.

Figure 9A:
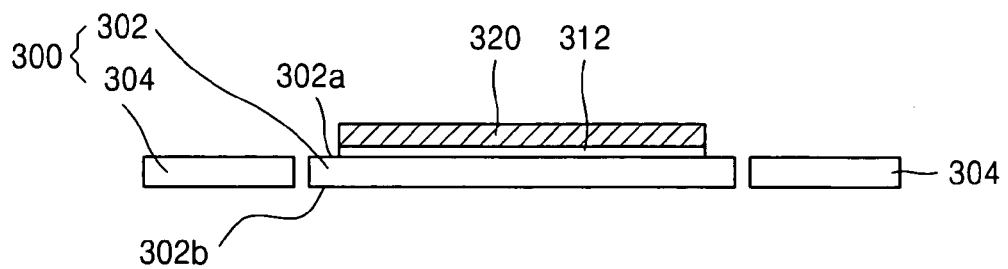
FIGS. 9A–9G are cross-sectional views illustrating a method of manufacturing an integrated circuit chip package according to a first exemplary embodiment of the present invention.

FIGS. 9A–9G are cross-sectional views illustrating a method of manufacturing an integrated circuit chip package according to a first exemplary embodiment of the present invention. Hereinafter, a process for manufacturing a DDP will be described. Referring to FIG. 9A, a lead frame 300 including a die pad 302 having a first surface 302a and a second surface 302b on opposite sides of the die pad 302, and a lead fingers 304 formed is prepared.

In order to attach a semiconductor chip on each of the first surface 302a and the second surface 302b of the die pad 302, the lead frame 300 is loaded into the exemplary in-line integrated circuit chip packaging apparatus 100 as depicted in FIG. 3. Alternatively, the exemplary in-line integrated circuit chip packaging apparatus 200 as depicted in FIG. 7 may be used.

The frame 300 is loaded to the first fabricating unit 120 with the first surface 302a directed upward. Then, a first semiconductor chip 320 is attached to the first surface 302a of the die pad 302 in the first fabricating unit 120 using an adhesive tape 312 made of a UV tape or other suitable material. The lead frame 300 is then conveyed to the buffer 140 from the first fabricating unit 120, and conveyed to the reversing unit 150 by the first lead frame conveyor 160.

Figure 9B:
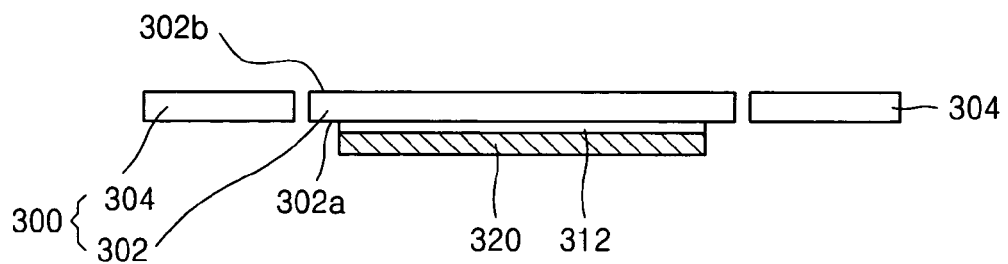

Referring to FIG. 9B, the lead frame 300 with the first semiconductor chip 320 attached on the first surface 302a is rotated 180° by the reversing unit 150 so that the second surface 302b of the die pad 302 is directed upward. The lead frame 300 is then conveyed to the second package fabricating unit 130 by the second lead frame conveyor 170.

Figure 9C:
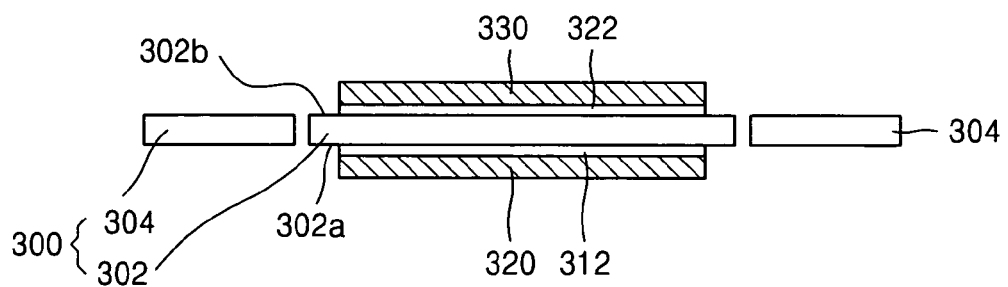

Referring to FIG. 9C, a second semiconductor chip 330 is attached to the second surface 302b of the die pad 302 using an adhesive tape 322 made of a UV tape or other suitable material. Afterward, the lead frame 300 is unloaded from the in-line integrated circuit chip packaging apparatus 100 by the unloading unit 180.

Figure 9D:
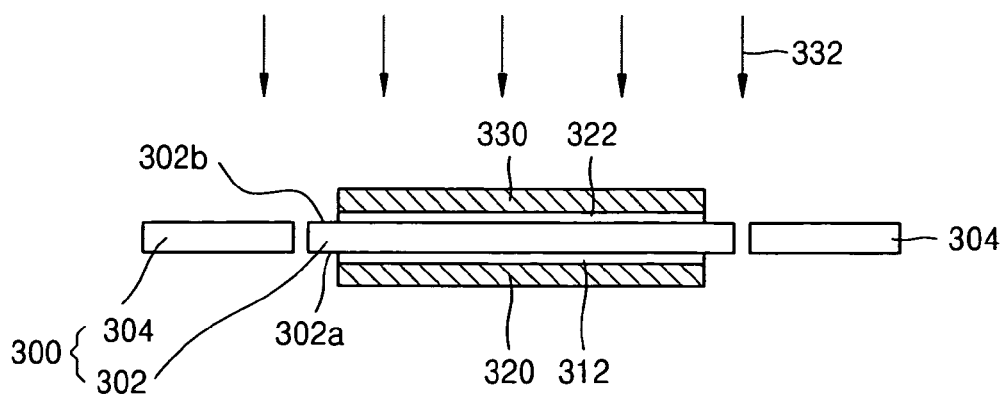
Figure 9E:
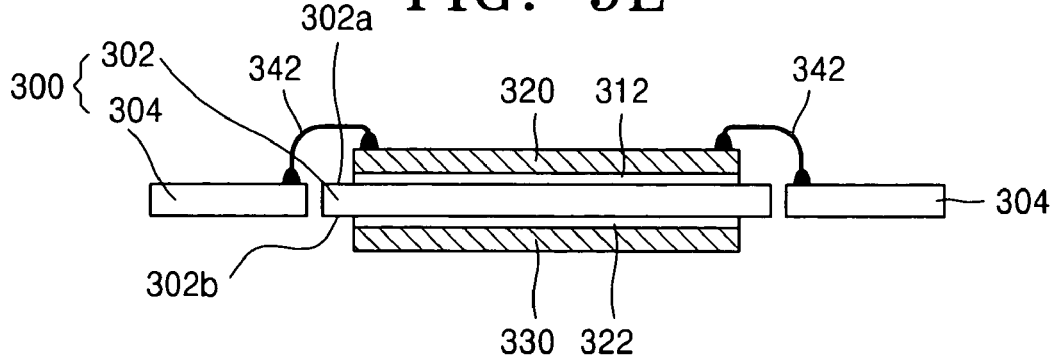

Referring to FIG. 9D, the lead frame 300 having the first semiconductor chip 320 on the first face 302a and the second semiconductor chip 330 on the second face 302b is then heat treated 332 in an oven in order to cure the adhesive tapes 312 and 322. The temperature of the oven may, for example, be maintained at 180° C. and the lead frames treated for a predetermined time, i.e., approximately 60 minutes, to obtain the desired cure of the adhesive.

Referring to 9E, for performing a wire bonding process on the lead frame 300 having the first semiconductor chip 320 on the first surface 302a and the second semiconductor 330 on the second surface 302b, the exemplary in-line integrated circuit chip packaging apparatus 100 as depicted in FIG. 4 is used. Alternatively, the exemplary in-line integrated circuit chip packaging apparatus 200 as depicted in FIG. 8 may be used.

The lead frame 300, the first surface 302a of which is directed upward, is loaded to the first wire bonding unit 122 by a loading unit 110. A first series of bonding wires 342 that electrically connect the first semiconductor chip 320 and the lead fingers 304 may be formed in the first wire bonding unit 122. The lead frame 300 is then conveyed to the reversing unit 150 in the buffer 140 by the first lead frame conveyor 160.

Figure 9F:
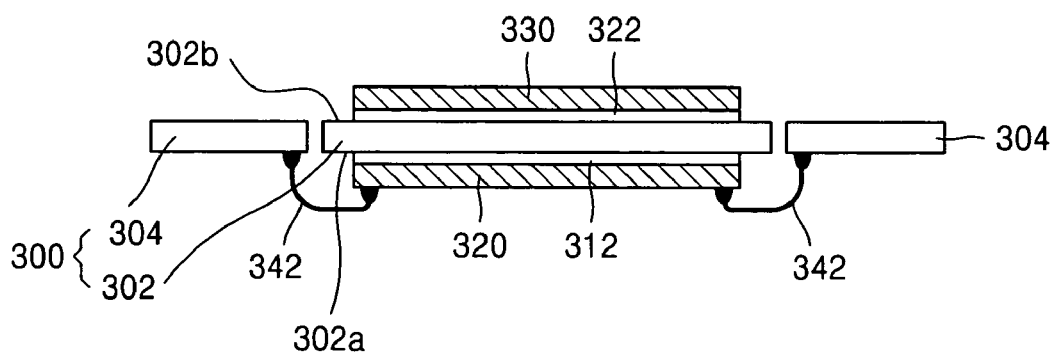

Referring to FIG. 9F, the lead frame 300 is rotated 180° using the reversing unit 150 so that the second surface 302b of the die pad 302 is directed upward. The lead frame 300 is then conveyed to the second wire boding unit 124 by the second lead frame conveyor 170.

Figure 9G:
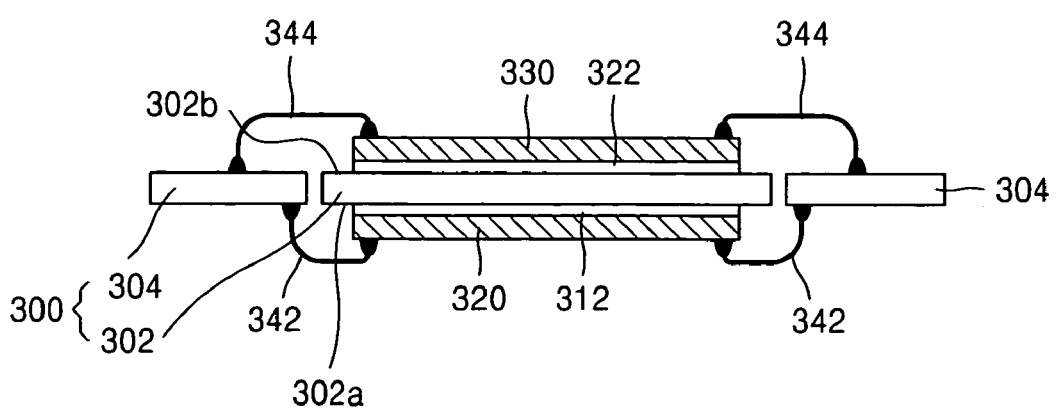

Referring to FIG. 9G, the lead frame 300, the second surface 302b of which is directed upward is placed in the second wire bonding unit 124. In this state, a second series of bonding wires 344 may be formed to connect the second semiconductor chip 330 and the lead fingers 304.

The lead frame 300 is then unloaded by the unloading unit 180, and the first semiconductor chip 320, the second semiconductor chip 330, the first wire bond 342, and the second wire bond 344 are encapsulated in a plastic material such as an epoxy molding compound (EMC) using a conventional molding method to complete the formation of the DDP.

FIGS. 10A–10G are cross-sectional views illustrating a method of manufacturing an integrated circuit chip package according to a second exemplary embodiment of the present invention in which a process for manufacturing a QDP will be described. Referring to 10A, a lead frame 300 including a die pad 302 having a first surface 302a and a second surface 302b on opposite sides of the die pad 302, and lead fingers 304 is prepared.

A first semiconductor chip 320 and a second semiconductor chip 330 are attached to the first surface 302a and the second surface 302b, respectively, using the method of manufacturing the DDP described above with reference to FIGS. 9A–9G. The first and the second semiconductor chips 320, 330 are then connected to lead fingers 304 using first bonding wires 342 and second bonding wires 344, respectively.

Afterward, the lead frame 300 is loaded by a loader 110 to an exemplary in-line integrated circuit chip packaging apparatus 100 that includes a first package fabricating unit 120 and a second package fabricating unit 130 as depicted in FIG. 3. The first and second packaging fabricating units 120 and 130 are die attaching units. Alternatively, the exemplary in-line integrated circuit chip packaging apparatus 200 as depicted in FIG. 7 may be used.

The lead frame 300, the first surface 302a of which is directed upward, is placed in the first package fabricating unit 120. In the first package fabricating unit 120, a third semiconductor chip 360 is attached to the first semiconductor chip 320, which is attached to the first surface 302a of the die pad 302, using an adhesive tape 352 made of polyimide or other suitable material. The lead frame 300 is then conveyed to the reversing unit 150 of the buffer 140 by the first lead frame conveyor 160.

Figure 10A:
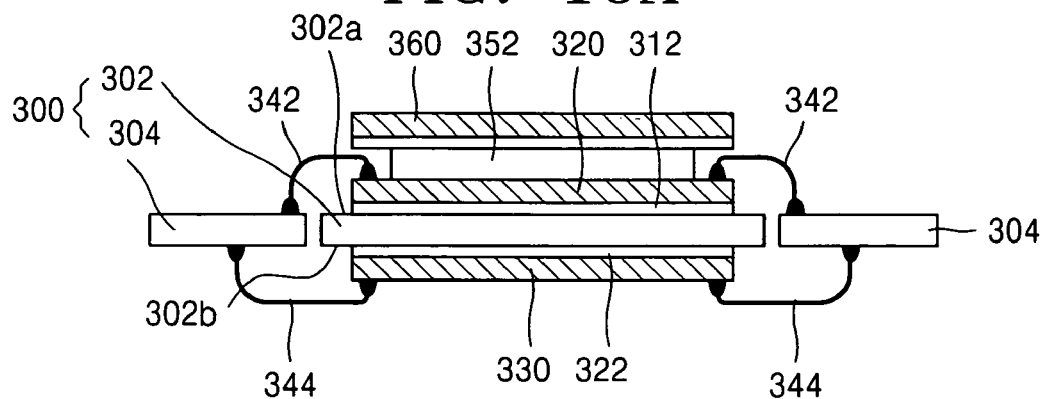
FIGS. 10A–10G are cross-sectional views illustrating a method of manufacturing an integrated circuit chip package according to a second exemplary embodiment of the present invention.
Figure 10B:
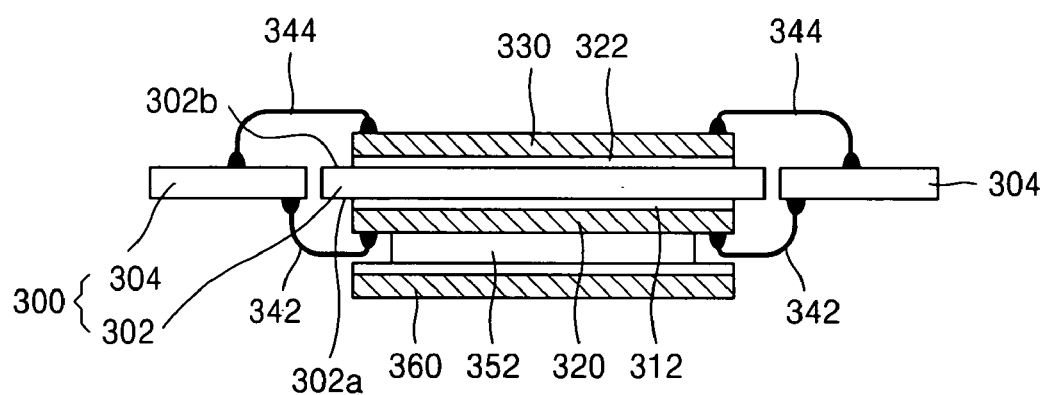

Referring to FIG. 10B, the lead frame 300 is rotated 180° using the reversing unit 150 so that the second surface 302b of the die pad 302 is directed upward. The lead frame is then conveyed to the second package fabricating unit 130 by the second lead frame conveyor 170.

Figure 10C:
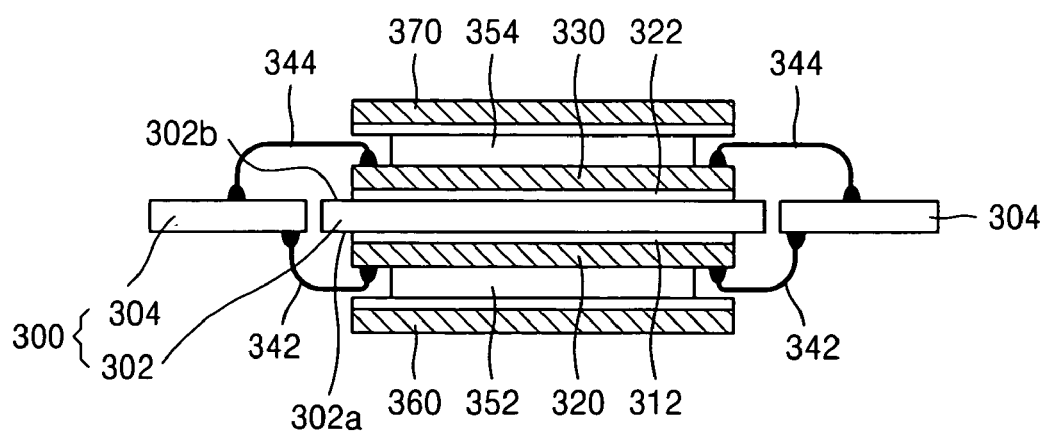

Referring to FIG. 10C, the lead frame 300, the second surface 302b of which is directed upward, is placed in the second package fabricating unit 130. In the second package fabricating unit 130, a fourth semiconductor chip 370 is attached to the second semiconductor chip 330, which is attached to the second surface 302b of the die pad 302, using an adhesive tape 354 made of polyimide or other suitable material. The lead frame is then unloaded from the exemplary in-line integrated circuit chip packaging apparatus 100 by an unloading unit 180.

Figure 10D:
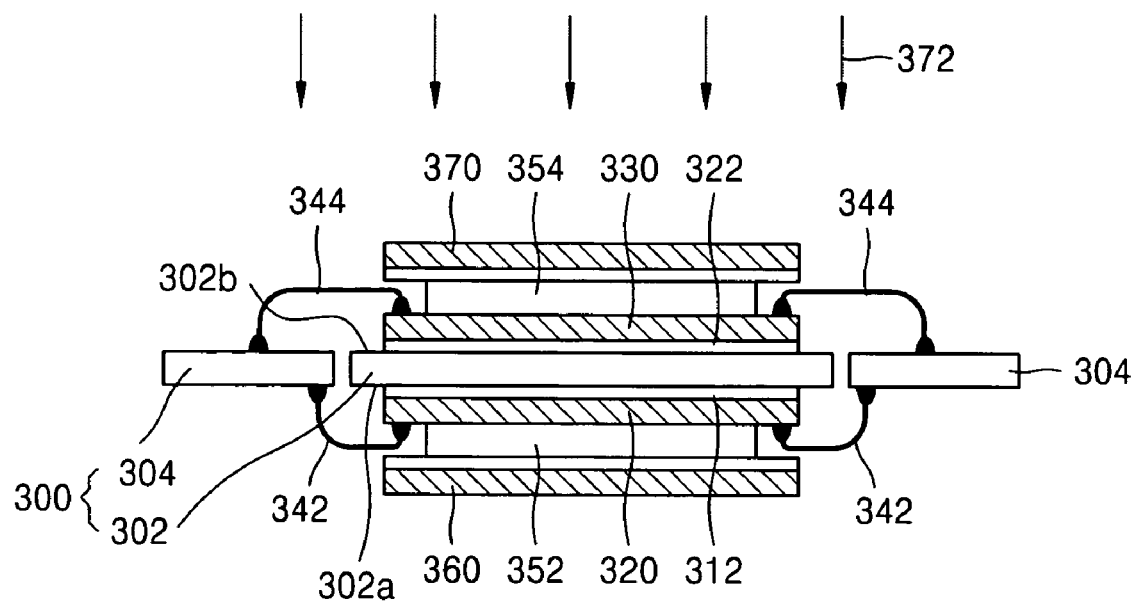
Figure 10E:
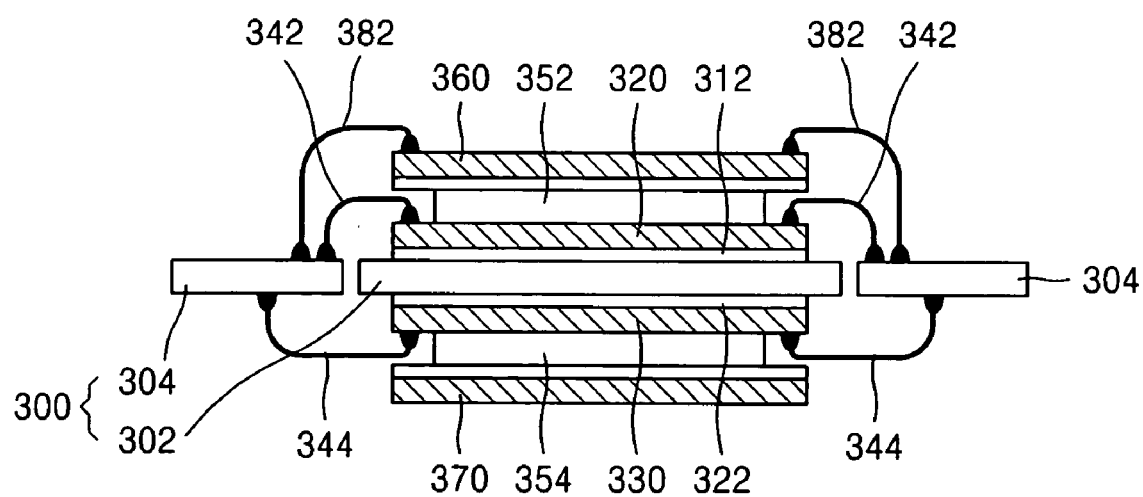

Referring to FIG. 10D, the lead frame 300 having the first semiconductor chip 320, the second semiconductor chip 330, the third semiconductor chip 360, and the fourth semiconductor chip 370 is then heat treated 372 in an oven in order to cure the adhesive tapes 352 and 354. The temperature of the oven may be maintained at 180° C. and the heat treatment may have a duration of about 60 minutes to cure the adhesive tapes sufficiently. Those of ordinary skill in the art will appreciate that the combination of curing time, curing temperature and applied curing energy may be adapted for a range of conventional adhesives.

Afterward, using the exemplary in-line integrated circuit chip packaging apparatus shown in FIG. 4, a wire bonding process for electrically connecting the third and fourth semiconductor chips 360, 370 to the lead fingers 304 is performed. For this bonding process, the exemplary in-line integrated circuit chip packaging apparatus shown in FIG. 8 can also be used. Referring to 10E, the lead frame 300, the first surface 302a of which is directed upward, is loaded in the first wire bonding unit 122 by the loading unit 110. A third series of bonding wires 382 for electrically connecting the third semiconductor chip 360 to the lead finger 304 may then be formed. The lead frame 300 is then conveyed to the reversing unit 150 of the buffer 140 by the first lead frame conveyor 160.

Figure 10F:
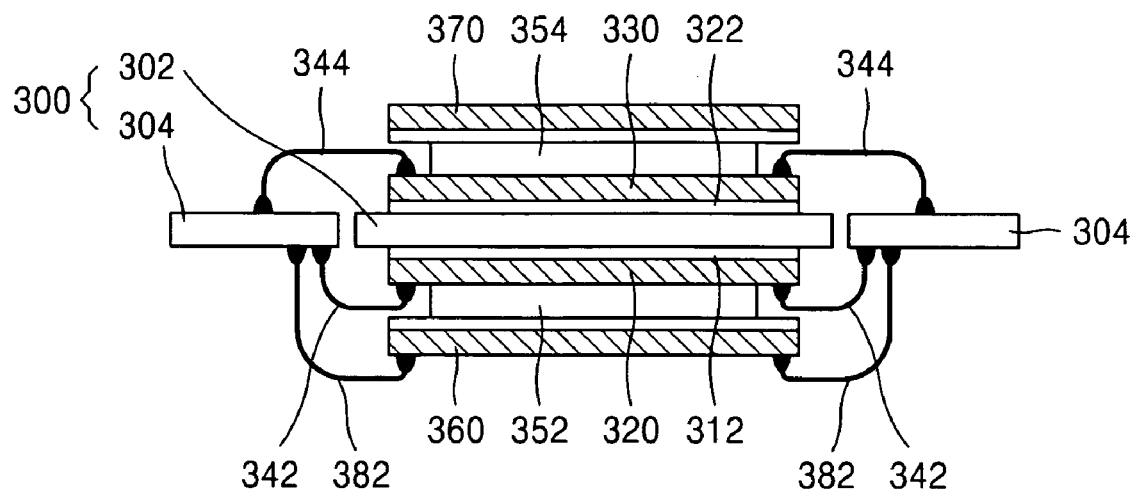
Figure 10G:
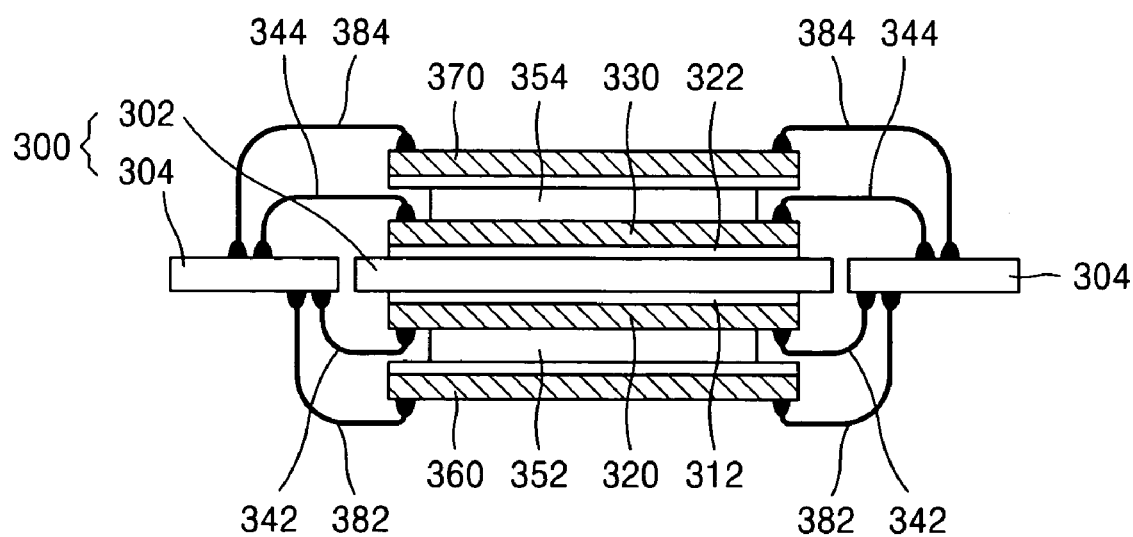

Referring to FIG. 10F, the lead frame 300 is rotated 180° by the reversing unit 150 so that the second surface 302b is directed upward. The lead frame 300 is conveyed to the second wire bonding unit 124 by the second lead frame conveyor 170. Referring to FIG. 10G, the lead frame 300, the second surface 302b of which is directed upward, is placed in the second wire bonding unit 124. In this state, a fourth series of bonding wires 384 may be formed to electrically connect the fourth semiconductor chip 370 to the lead fingers 304.

The lead frame 300 is unloaded from the second wire bonding unit 124 by the unloading unit 180, and the first semiconductor chip 320, the second semiconductor chip 330, the third semiconductor chip 360, the fourth semiconductor chip 370, the first bonding wires 342, the second bonding wires 344, the third bonding wires 382, and the fourth bonding wires 384 are encapsulated in a plastic material such as an epoxy molding compound (EMC) using a conventional molding method. Then, the formation of a QDP is complete.

While methods of in-line integrated circuit chip packaging according to exemplary embodiments of the present invention have been described with respect to the in-line integrated circuit packaging apparatus 100 and apparatus illustrated in FIG. 4, one skilled in the art would understand how to adapt and perform these methods using the in-line integrated circuit chip packaging apparatus 200 and the apparatus illustrated in FIG. 8.

As described above, the in-line integrated circuit chip packaging apparatus according to the exemplary embodiments of the present invention include a buffer assembly or buffer that connects a first and the second package fabricating units which are each composed of a die attaching unit and/or a wire bonding unit, with the buffer interposed between the first and the second package fabricating units including a reversing unit that rotates a lead frame by 180°. Manual handling of the lead frames by operators is reduced because the exemplary processes for attaching semiconductor chips on the surfaces of the lead frame and electrically connecting the semiconductor chips to the lead frame are performed using an exemplary in-line apparatus.

For example, when manufacturing a conventional DDP, the number of times manual handling is required for an attaching process, a curing process, and a wiring process can be reduced from the five typically required in the conventional process to two, and when manufacturing a conventional QDP, the manual handling can be reduced from eleven typically required in the conventional process to the five or fewer handling steps required by the exemplary apparatus and method according to the present invention.

According to the exemplary embodiment of the present invention, therefore, the number of manual operations and the turn around time (TAT) can both be reduced by simplifying the doubled-sided stack multi-chip packaging process, thereby increasing the productivity of the integrated circuit chip packaging process.

While this invention has been particularly shown and described with reference to certain exemplary embodiments thereof, it will be understood by those skilled in the art that various changes in form and details may be made therein without departing from the spirit and scope of the invention as defined by the appended claims.

What is claimed is:

1. An in-line integrated circuit chip packaging apparatus comprising:
    a processing unit, the processing unit being arranged and configured for receiving a lead frame and performing a first chip packaging operation on the lead frame to obtain a processed lead frame; and
    a reversing unit cooperating with the processing unit for receiving the processed lead frame and selectively reversing the orientation of the processed lead frame to obtain a reversed lead frame, wherein the reversing unit includes a guide rail arranged and configured for receiving and holding the processed lead frame, the guide rail having a longitudinal axis and a driving assembly arranged and configured to rotate the guide rail and the processed lead frame through a predetermined arc.

2. An in-line integrated circuit chip packaging apparatus according to claim 1, further comprising:
    a fixing unit arranged and configured for selectively engaging the processed lead frame and maintaining an initial orientation between the processed lead frame and the guide rail as the driving assembly rotates the guide rail and the processed lead frame through the predetermined arc.

3. An in-line integrated circuit chip packaging apparatus according to claim 1, wherein:
the predetermined arc is 180°.

4. An in-line integrated circuit chip packaging apparatus according to claim 3, wherein:
the rotation of the guide rail proceeds at a rotation rate, wherein the rotation rate varies according to a predetermined sequence during the rotation of the guide rail through the predetermined arc.

5. An in-line integrated circuit chip packaging apparatus according to claim 1, wherein:
the driving assembly includes an air cylinder, the air cylinder being arranged and configured to rotate a driving shaft, the driving shaft being connected to the guide rail during the rotation of the guide rail.

6. An in-line integrated circuit chip packaging apparatus comprising:
a processing unit, the processing unit being arranged and configured for receiving a lead frame and performing a first chip packaging operation on the lead frame to obtain a processed lead frame, wherein the processing unit is arranged and configured for receiving the reversed lead frame from the reversing unit and performing a second chip packaging operation on the reversed lead frame to obtain a completed lead frame; and a reversing unit cooperating with the processing unit for receiving the processed lead frame and selectively reversing the orientation of the processed lead frame to obtain a reversed lead frame, wherein the reversing unit is arranged and configured for receiving the completed lead frame and passing the completed lead frame to a receiving unit.

7. An in-line integrated circuit chip packaging apparatus according to claim 6 wherein:
the reversing unit is arranged and configured to reverse the orientation of the completed lead frame before passing the completed lead frame to the receiving unit.

* * * * *